US009464362B2

(12) United States Patent
Scanlan et al.

(10) Patent No.: US 9,464,362 B2
(45) Date of Patent: Oct. 11, 2016

(54) MAGNETICALLY SEALED WAFER PLATING JIG SYSTEM AND METHOD

(71) Applicant: Deca Technologies Inc.

(72) Inventors: Christopher M. Scanlan, Chandler, AZ (US); Ferdinand Aldas, Cavite (PH); Kenneth C. Blaisdell, Gilbert, AZ (US); Cheryl R. Abanes, Binan (PH)

(73) Assignee: DECA Technologies Inc., Tempe, AZ (US)

( * ) Notice: Subject to any disclaimer, the term of this patent is extended or adjusted under 35 U.S.C. 154(b) by 773 days.

(21) Appl. No.: 13/631,204

(22) Filed: Sep. 28, 2012

(65) Prior Publication Data

US 2014/0024178 A1    Jan. 23, 2014

Related U.S. Application Data

(60) Provisional application No. 61/673,115, filed on Jul. 18, 2012.

(51) Int. Cl.
| | | |
|---|---|---|
| *C25D 17/06* | (2006.01) | |
| *H01L 21/687* | (2006.01) | |
| *C25D 17/00* | (2006.01) | |
| *H01L 23/31* | (2006.01) | |

(52) U.S. Cl.
CPC ............ *C25D 17/001* (2013.01); *C25D 17/06* (2013.01); *H01L 21/68721* (2013.01); *H01L 23/3114* (2013.01); *H01L 2924/0002* (2013.01)

(58) Field of Classification Search
CPC ................ C25D 17/001; C25D 17/06; H01L 21/67709; H01L 21/68721
See application file for complete search history.

(56) References Cited

U.S. PATENT DOCUMENTS

| | | | |
|---|---|---|---|
| 2,505,531 A | 4/1950 | Ellwood | |
| 4,378,189 A | 3/1983 | Takeshita et al. | |
| 5,556,814 A | 9/1996 | Inoue et al. | |
| 6,032,997 A * | 3/2000 | Elliott | B25B 11/005 269/21 |

(Continued)

FOREIGN PATENT DOCUMENTS

| | | |
|---|---|---|
| JP | 61156840 | 7/1986 |
| TW | I241699 B | 10/2005 |

OTHER PUBLICATIONS

Herrault, F., Fabrication and Performance of Silicon-Embedded Permanent-Magnet Microgenerators, Journal of Microelectromechanical Systems, vol. 19, Issue 1, pp. 3-13, Feb. 200.

(Continued)

*Primary Examiner* — Bryan D. Ripa
(74) *Attorney, Agent, or Firm* — Booth Udall Fuller, PLC (57) ABSTRACT

A wafer plating jig system comprising an electrically insulating wafer plating jig base having a plurality of overlapping cavities of different depths, each cavity configured to receive a semiconductor wafer of a different size and an electrically conductive cover plate comprising an open center surrounded by a support, the cover plate comprising an electrical conductor surrounding the open center and with at least one of the overlapping cavities of the wafer plating jig base.

33 Claims, 7 Drawing Sheets

(56) References Cited

U.S. PATENT DOCUMENTS

| | | | |
|---|---|---|---|
| 6,164,633 A * | 12/2000 | Mulligan | B25B 11/005 269/21 |
| 6,303,010 B1 * | 10/2001 | Woodruff | H01L 21/288 204/297.01 |
| 6,365,020 B1 | 4/2002 | Yoshioka et al. | |
| 6,395,581 B1 | 5/2002 | Choi | |
| 6,517,697 B1 * | 2/2003 | Yamagata | C25D 11/32 134/26 |
| 6,538,733 B2 * | 3/2003 | Gaal | H01L 21/6838 356/244 |
| 7,223,162 B2 | 5/2007 | Jaenen et al. | |
| 7,331,780 B2 | 2/2008 | Adachi | |
| 7,712,211 B2 | 5/2010 | Chia et al. | |
| 7,780,824 B2 | 8/2010 | Yamamoto et al. | |
| 7,830,011 B2 | 11/2010 | Nomoto et al. | |
| 8,106,488 B2 | 1/2012 | Chua et al. | |
| 2002/0029963 A1 * | 3/2002 | Yoshioka | C25D 17/06 204/224 R |
| 2005/0101138 A1 | 5/2005 | Guo et al. | |
| 2006/0207916 A1 * | 9/2006 | Mimura | G03F 1/66 206/710 |
| 2009/0093085 A1 | 4/2009 | Onodera et al. | |
| 2009/0114549 A1 * | 5/2009 | Albright, Jr. | B24B 37/16 205/710 |
| 2009/0233429 A1 | 9/2009 | Ishikawa et al. | |
| 2009/0245983 A1 | 10/2009 | Law et al. | |
| 2011/0308955 A1 * | 12/2011 | Olson | H01L 21/68728 205/123 |
| 2012/0024230 A1 | 2/2012 | Li et al. | |
| 2014/0251798 A1 * | 9/2014 | Yoshioka | C25D 17/001 204/297.01 |

OTHER PUBLICATIONS

Golda, D. et al., Two-Layer Electroplated Microcoils With a PECVD Silicon Dioxide Interlayer Dielectric, Journal of Microelectromechanical Systems, vol. 17, Issue 6, pp. 1537-1545, Dec. 2008.

* cited by examiner

MAGNETICALLY SEALED WAFER PLATING JIG SYSTEM AND METHOD

CROSS REFERENCE TO RELATED APPLICATIONS

This document claims the benefit of the filing date of U.S. Application No. 61/673,115, entitled "Plating Jig for WLCSP Application", which was filed on Jul. 18, 2012, the disclosure of which is incorporated by reference herein in its entirety.

TECHNICAL FIELD

This disclosure relates to the field of semiconductor device manufacturing and, in particular, to a system for wafer plating.

BACKGROUND

Integrated circuits are formed through a process known as semiconductor device fabrication. The semiconductor device may be formed on a thin slice, or wafer, of semiconductor material, such as silicon crystal. The wafer serves as a substrate for microelectronic devices built on the wafer. During fabrication of these integrated circuits, the silicon wafer is put through a sequence of wet chemical processing steps. One wet chemical processing step in the sequence is electrochemical deposition, commonly known as electroplating.

In the electroplating process, electrical current is used to deposit metal ions from a solution onto a wafer, forming a film or patterned structure or layer of metal on the wafer. Certain semiconductor packaging technologies, such as Wafer Level Chip Scale Packaging and Flip Chip, involve multiple electroplating steps. A proper size of a shield between the anode and the wafer is critical to achieve plating uniformity across the wafer surface during the electroplating process.

SUMMARY

According to a first aspect of the disclosure, a wafer plating jig system may comprise an electrically insulating wafer plating jig base having a plurality of at least partially overlapping cavities of different depths, each cavity configured to receive a semiconductor wafer of a different size, a plurality of magnetic attractors, at least one positioned within each of the plurality of overlapping cavities, and an electrically conductive cover plate comprising an open center surrounded by a support, the cover plate comprising a magnetically attractive material positioned within the support adjacent to the open center and aligned with at least one of the magnetic attractors when the cover plate is positioned over the wafer plating jig base.

Particular embodiments may comprise one or more of the following. The magnetically attractive material may comprise a ferro-magnetic material. The magnetically attractive material may comprise iron. The cover plate may further comprise an RFID tag. The cover plate may further comprise an inner compression fit seal adjacent to the open center and on a surface facing the wafer plating jig base when the cover plate is positioned over the wafer plating jig base concentric with at least one of the plurality of overlapping cavities. The cover plate may further comprise an outer compression fit seal distal to the open center and on a surface of the cover plate facing the wafer plating jig base when the cover plate is positioned over the wafer plating jig base concentric with at least one of the plurality of overlapping cavities. At least one of the plurality of magnetic attractors may be positioned between the outer compression fit seal and an outer edge of one of the overlapping cavities when the cover plate is positioned over the wafer plating jig base with the open center with the plurality of overlapping cavities. A first of the plurality of overlapping cavities may be configured to receive a round wafer having a diameter of 200 millimeters. A second of the plurality of overlapping cavities may be configured to receive a round wafer having a diameter of 300 millimeters or 450 millimeters. The cover plate may further comprise an electrically conductive conductor on the support surrounding the open center, wherein the cover plate may further comprise at least one electrically conductive contact pin removably coupled with the electrically conductive conductor. The cover plate may comprise a first cover plate, the system further comprising a second cover plate comprising an open center larger than the open center of the first cover plate and surrounded by a support, the second cover plate comprising a magnetically attractive material positioned within the support adjacent to the open center and aligned with a different one of the magnetic attractors of the base than the first cover plate's magnetically attractive material is aligned with when the cover plate is positioned over the wafer plating jig base. The plurality of overlapping cavities may be a first plurality of overlapping cavities and being positioned on a first side of the wafer plating jig base, the wafer plating jig base further comprising a second plurality of overlapping cavities positioned on a second side of the wafer plating jig base opposite the first side. The cover plate may comprise a first cover plate, the system may further comprise a second cover plate comprising an open center surrounded by a support, the second cover plate comprising a magnetically attractive material positioned within the support adjacent to the open center and aligned with at least one of the magnetic attractors of the second plurality of magnetic attractors when the second cover plate is positioned over the second side of the wafer plating jig base.

In another aspect, the disclosure relates to a method of producing a semiconductor wafer which may comprise placing a semiconductor wafer into a first of a plurality of overlapping cavities of different depths and different widths within an electrically insulating base of a wafer plating jig, each of the plurality of cavities comprising a magnetic attractor positioned with the magnetic attractor of a second cavity of the plurality of cavities, magnetically coupling an electrically conductive cover plate with a support surrounding an open center to the base over the semiconductor wafer such that an edge of the semiconductor wafer is covered by and electrically connected to the cover plate and a center of the semiconductor wafer is exposed through the open center, and plating at least a portion of the exposed center of the semiconductor wafer with a layer of electrically conductive metal while the semiconductor wafer is positioned between the magnetically coupled base and cover plate.

Particular embodiments may comprise one or more of the following. Sealing a junction between the semiconductor wafer and the cover plate with a seal positioned around the open center of the cover plate and in contact with the wafer during plating. Sealing a junction between the cover plate and the base with a seal positioned on the cover plate distal to the open center of the cover plate, the seal comprising an electrical contact that creates an electrical connection with a surface of the semiconductor wafer. Identifying characteristics of the semiconductor wafer to be plated by storing relational data in an RFID tag on the cover plate. Immersing the jig assembly in a plating bath having an anode and applying an electrical potential between the anode and the cover plate through at least one removable contact pin engaged with the semiconductor wafer. The semiconductor wafer may be a first semiconductor wafer and the cover plate may be a first cover plate, the method may further comprise removing the first semiconductor wafer from the first cavity and placing a second semiconductor wafer into the second cavity, the second cavity having a different width than the first cavity, magnetically coupling a second cover plate, having a support surrounding an open center of a different size than the open center of the first cover plate, over the second semiconductor wafer such that an edge of the second semiconductor wafer is covered by the second cover plate and a center of the second semiconductor wafer is exposed through the open center of the second cover plate, and plating at least a portion of the exposed center of the second semiconductor wafer with a layer of copper while the second semiconductor wafer is positioned between the magnetically coupled base and second cover plate. The first semiconductor wafer may comprise a diameter of 200 millimeters. The second semiconductor wafer may comprise a diameter of 300 millimeters.

In another aspect, a wafer plating jig system may comprise an electrically insulating wafer plating jig base having a plurality of concentric overlapping cavities of different depths, each cavity configured to receive a semiconductor wafer of a different size, and an electrically conductive cover plate comprising an open center surrounded by a support, the cover plate comprising an electrical conductor surrounding the open center and concentric with at least one of the concentric overlapping cavities of the wafer plating jig base.

In another aspect, a wafer plating jig system may comprise an electrically insulating wafer plating jig base having at least one cavity configured to receive a semiconductor wafer, at least one magnetic attractor positioned within the at least one cavity adjacent to an edge of the at least one cavity, and an electrically conductive cover plate comprising an open center surrounded by a support, the cover plate comprising a magnetically attractive material positioned within the support adjacent to the open center and aligned with the at least one magnetic attractor when the cover plate is positioned over the wafer plating jig base.

Particular embodiments may comprise one or more of the following. The magnetically attractive material may comprise a ferro-magnetic material. The magnetically attractive material may comprise iron. The cover plate may further comprise an embedded RFID tag. The cover plate may further comprise an inner compression fit seal adjacent to the open center and on a surface facing the wafer plating jig base when the cover plate is positioned over the wafer plating jig base concentric with the at least one cavity. The cover plate may further comprise an outer compression fit seal distal to the open center and on the surface facing the wafer plating jig base when the cover plate is positioned over the wafer plating jig base concentric with the at least one cavity. The at least one magnetic attractor may be positioned between the outer compression fit seal and an outer edge of the at least one cavity when the cover plate is positioned over the wafer plating jig base with the open center concentric with the at least one cavity. The at least one cavity may be configured to receive a round wafer having a diameter of 200 millimeters. The at least one cavity may be configured to receive a round wafer having a diameter of 300 millimeters or 450 millimeters. The cover plate may further comprise an electrically conductive conductor on the support surrounding the open center, wherein the cover plate further comprises at least one electrically conductive contact pin removably coupled with the electrically conductive conductor. A second electrically conductive cover plate may comprise a magnetically attractive material positioned within a support adjacent to an open center of the second cover plate and aligned with the at least one magnetic attractor when the cover plate is positioned over the wafer plating jig base. At least a second cavity may be located on a side of the wafer plating jig base that is opposite a side of the wafer plating jig base on which the at least one cavity is located.

Aspects and applications of the disclosure presented here are described below in the drawings and detailed description. The foregoing and other aspects, features, and advantages will be apparent to those artisans of ordinary skill in the art from the DETAILED DESCRIPTION and DRAWINGS, and from the CLAIMS.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular embodiments may vary from these exemplary details and still be contemplated to be within the scope of the present disclosure and claims.

Reference in the description to "one embodiment" or "an embodiment" means that a particular feature, structure, or characteristic described in connection with the embodiment is included in at least one embodiment. The phrase "in one embodiment" located in various places in this description does not necessarily refer to the same embodiment.

Figure 1:
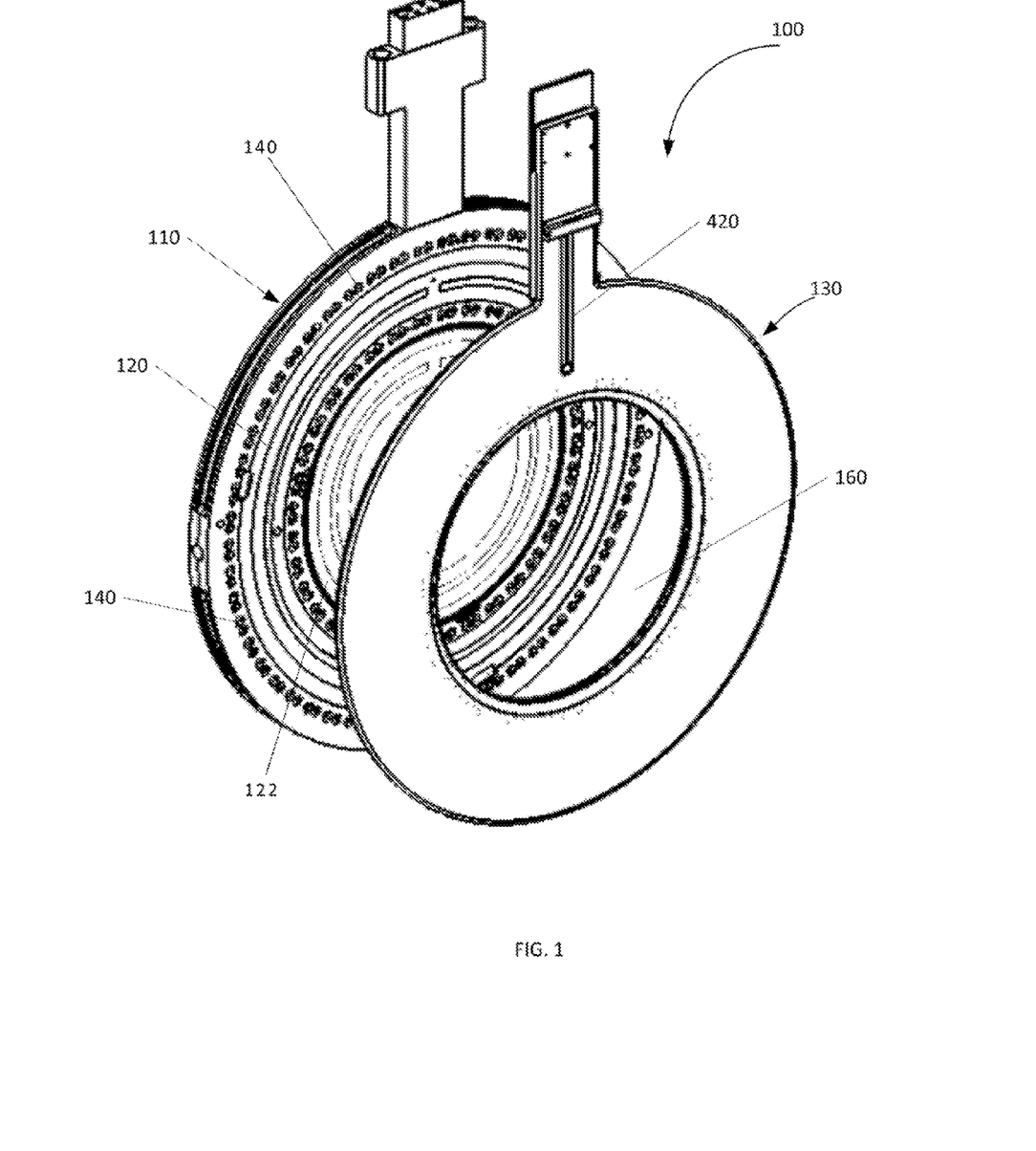
FIG. 1 is a perspective view of an embodiment of a wafer plating jig and cover.

FIG. 1 illustrates an embodiment of a wafer plating jig system 100 according to an embodiment of the disclosure. As shown, the system comprises a base 110 that has at least one cavity 120, 122, or a plurality of cavities 120, 122, that is sized and shaped to receive a semiconductor wafer (see wafer 160 in FIG. 4A). The base 110 is depicted here having a round wafer shape, however, the base may also have any other geometric shape that is appropriate for plating wafers of shapes other than round, such as for example, square, rectangular, hexagonal, octagonal, etc. Additionally, it is not required that the shape of the base have any relation to the shape of the wafer placed in the base, though for practical reasons in most cases the shape of the at least one cavity 120 will most often match the shape of the wafer placed in the at least one cavity 120. In some embodiments, the base may have a plurality of cavities 120, 122 with overlapping footprints configured to receive semiconductor wafers of different sizes and dimensions. As a result of the overlapping footprints, a first cavity 120 (FIGS. 3A-3B) of the plurality of cavities 120, 122 may have a first width and a first depth within the base, and a second cavity 122 (FIGS. 3A-3B) of the plurality of cavities 120, 122 may have a second width, smaller than the first width) and a second depth, greater than the first depth, within the base resulting in a stepped or tiered construction for the transition of the first cavity 120 to the second cavity 122. This overlapping of cavities allows for the same base 110 to be used for wafers of different sizes. While the base may comprise any such material as would be known to one of ordinary skill in the art for use in a semiconductor wafer plating process, due to the base being used in conjunction with a semiconductor wafer plating process, it is preferable that the base is comprised of an electrically insulating material that does not react with the plating bath solution.

FIG. 1 illustrates a base 110 with a cover plate 130 on only a single side of the base 110. In other embodiments, such as that illustrated in FIG. 2, a wafer plating jig system 200 may comprise a base 210 with a plurality of cavities 120, 122 on two sides (both front and back) of the base 210. With a plurality of cavities 120, 122 on both front and back of the base 210, a first cover plate 130 can be placed on the front side of the base 210, and a second cover plate 230 can be placed on the back side of the base 210. Both cover plates and sides of the base 210 can be configured substantially the same, potentially even including all other features discussed in this disclosure, and even interchangeable, but having both sides the same allows for plating of a wafer on the front side and the back side of the base 210 at the same time within a tank. In particular embodiments, plating of a first wafer of a first dimension can be done on a first side of the base 210 while plating of a second wafer of a second dimension, different from the first dimension, can be done on the second side of the base 210.

Figure 2:
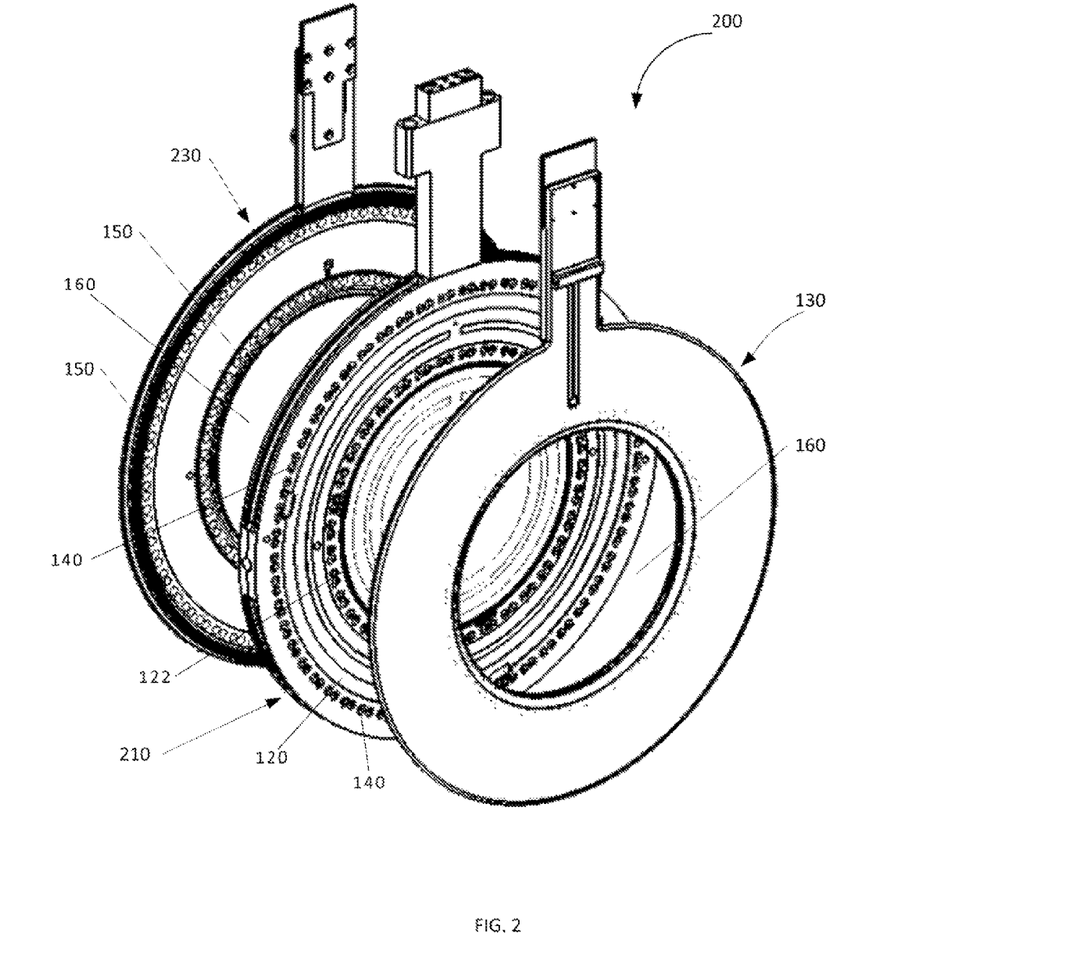
FIG. 2 is a perspective view of an embodiment of a dual-sided wafer plating jig and cover.

Referring to FIGS. 1 and 2, additionally, in some embodiments, the base 110, 210 also comprises one or more magnetic attractors 140 that are configured to attract and magnetically couple to a cover plate 130, 230 comprising a magnetically attractive component 150 that is comprised at least partially of a magnetically attractive material. Magnetically attractive material includes such material as is magnetically attracted to a magnet such as, without limitation, a ferro-magnetic material such as iron, or one or more electro-magnetic materials. While one of ordinary skill in the art will recognize that for portions of the cover 130, 230 used to magnetically couple with the magnetic attractors 140 of the base 110, 210, any magnetically attractive material may be used, but a ferro-magnetic material such as iron may be a more desirable exemplary material due to cost and availability advantages. In a particular embodiment, one or more ferro-magnetic rings 150 (FIG. 2) may be embedded or otherwise located on the cover plate 130, 230. While these ferro-magnetic rings 150 may be located anywhere on the cover plate 130, 230, in one particular embodiment, it may be preferable to locate ferro-magnetic rings 150 at positions within a support of the cover plate 130 substantially adjacent to an open center 160 of the cover plate 130 as well as substantially adjacent to an outer edge of the cover plate 130. Just as the base 110, 210 may have any shape, while the cover plate 130, 230 shown here is depicted as round, any other appropriate shape may also be used to accommodate semiconductor wafers having a shape other than round or a plating pattern needed that has a shape other than round. Such a design provides the advantage or eliminating any moving parts needed to clamp or secure the base 110, 210 to the cover plate 130, 230.

Figure 3A:
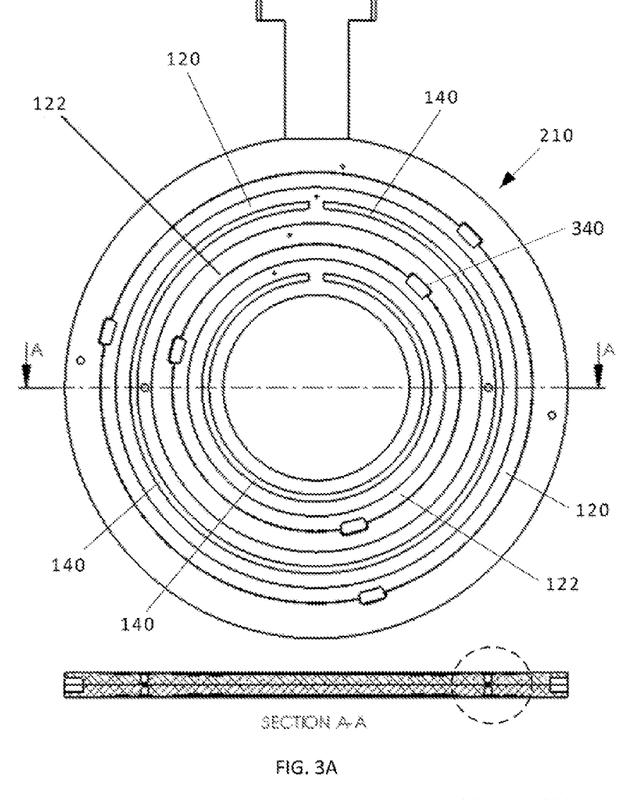
FIGS. 3A-B provide a cross-sectional view of an embodiment of a wafer plating jig base.
Figure 3B:
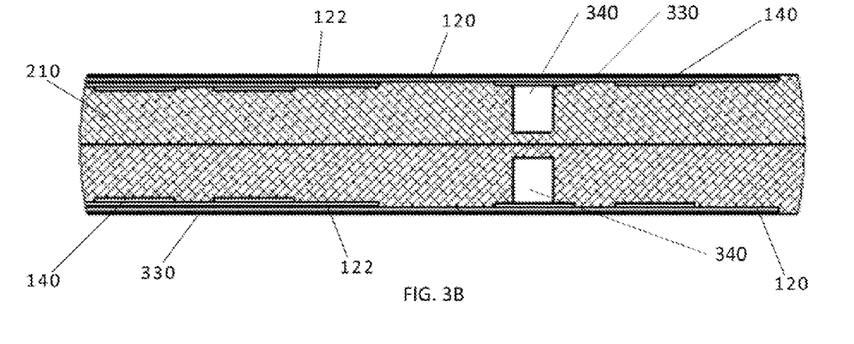
Figures 4A, 4B:
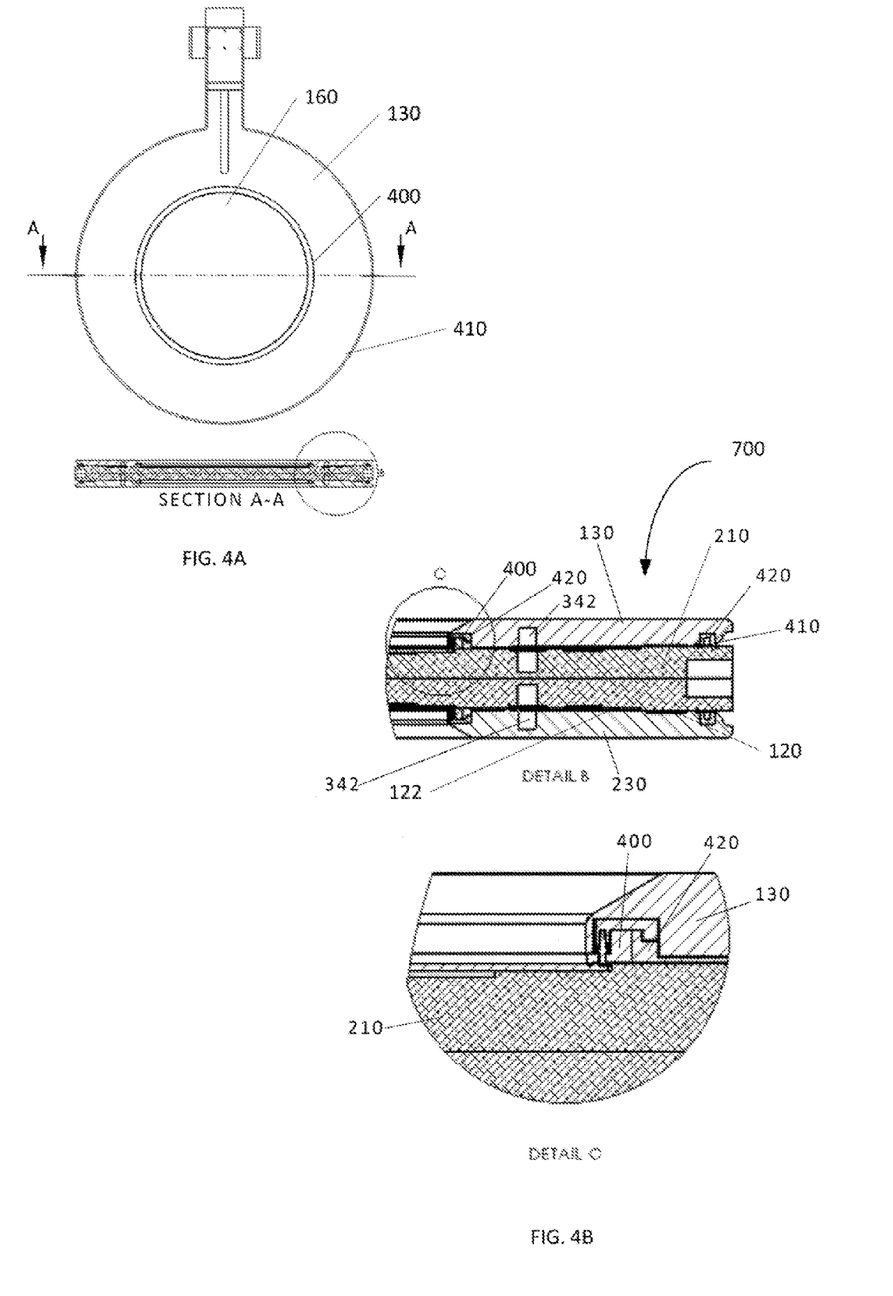
FIGS. 4A-B depict a cross-sectional view of an embodiment of an assembled wafer plating jig having replaceable seals and a removable pin.

FIG. 3B provides a cross-sectional view of the circled portion of FIG. 3A that shows an embodiment of a base 210 of a wafer plating jig system in which a plurality of cavities 120, 122 is present and configured to allow the base 210 to receive semiconductor wafers of varying dimensions. As shown, in a particular embodiment, each of the plurality of cavities 120, 122 has a depth that differs from that of an adjacent cavity. For example, a first cavity 120 has a depth relative to an uppermost surface 330 of the base 210 that is greater than that of adjacent second cavity 122. Cavities among the plurality of cavities 120, 122 may have a same or different cavity wall height relative to one another which allows the base to accommodate semiconductor wafers of varying thicknesses. Although the plurality of cavities 120, 122 in this embodiment includes two cavities, the base 210 may be configured to accommodate any number of cavities of varying sizes and depths. An advantage of using magnetic force rather than a mechanical clamping mechanism, which is typically used in wafer holding, may be that the force applied by the magnetic attraction is consistently applied around the surface of the wafer, whereas mechanical clamping mechanisms tend to wear over time and therefore may apply an inconsistent amount of force.

Magnetic attractors 140 may be embedded or otherwise located within or on a surface of the base 210 in such a position so as to allow the base 210 and the magnetically attractive components 150 (FIG. 2), such as a ferro-magnetic ring or other configuration of ferro-magnetic material of the cover plate 130, 230 to magnetically attract when the cover plate 130, 230 and base 210 have a semiconductor wafer secured between them for plating. In a particular embodiment, the plurality of cavities 120, 122 may be concentric along a common center axis and at least partially overlapping on the base 210 when viewed from above. In other particular embodiments, the plurality of cavities 120, 122 may be offset from each other on one or more axes, and not exactly concentric.

More precisely, FIG. 2 depicts an embodiment of a wafer plating jig system 200 having a dual-sided base 210 and first cover plate 130 and second cover plate 230 with the capability to plate carry two semiconductor wafers for plating simultaneously, one on each side of the base 210. In this embodiment, a second plurality of cavities 120, 122 may be present on an opposite side of the base 210 than the first plurality of cavities 120, 122 as described relative to FIG. 1. Additionally, as it is also desirable to create a magnetic seal, such as a ferro-magnetic seal, between the second cover plate 230 and the second side of the base 210, a second plurality of magnetic attractors 140 may be located on the second side of the base 210 at a location such as, for example, within one or more of the plurality of cavities 120, 122 on the second side of the base 210. In some embodiments, the base 210 may have only a single set of or single contiguous magnetic attractor 140 having magnetic properties of sufficient strength to attract the magnetically attractive materials present in both the first 130 and second 230 cover plates. In some embodiments, the magnetic attractor 140 may comprise any configuration of single or discrete magnetic elements and is not intended to be limited to a ring of discrete magnetic attractors 140.

Additionally, as shown in FIG. 4, the cover plate 130 may further comprise at least one of a replaceable inner compression fit seal 400 and replaceable outer compression fit seal 410 that is configured to create a liquid-tight seal between the base 210 and the cover plate 130, 230 during the wafer plating process. In some embodiments, the inner compression fit seal 400 is located adjacent to the open center 160 of cover plate 130 and on a surface of the cover plate 130, 230 that faces the base 210 during the plating process. The inner compression fit seal 400 and outer compression fit seal 410 may make contact with an edge of the semiconductor wafer during plating such that a seal between the cover plate 130, 230 and wafer is created. Additionally, in some embodiments, the outer compression fit seal 410 is located distally from the open center 160 of the cover plate 130, 230 and on a surface of the cover plate 130, 230 that faces the base 210 during the plating process. In some embodiments, at least one of the magnetic attractors 140 is located between the outer compression fit seal 410 and an outer edge of one of the cavities 120, 122 of the base when the cover plate 130, 230 is in use during the plating process. The inner and outer compression fit seals 400, 410 may be glued into a groove 420 on the cover plate 130, 230, but more commonly will simply be friction fit into the grooves 420. By friction fitting the compression fit seals 400, 410 into the grooves 420, the seals 400, 410 may easily be replaced if needed by simply pulling the seal out and compression fitting another seal.

Figures 5, 6, 7:
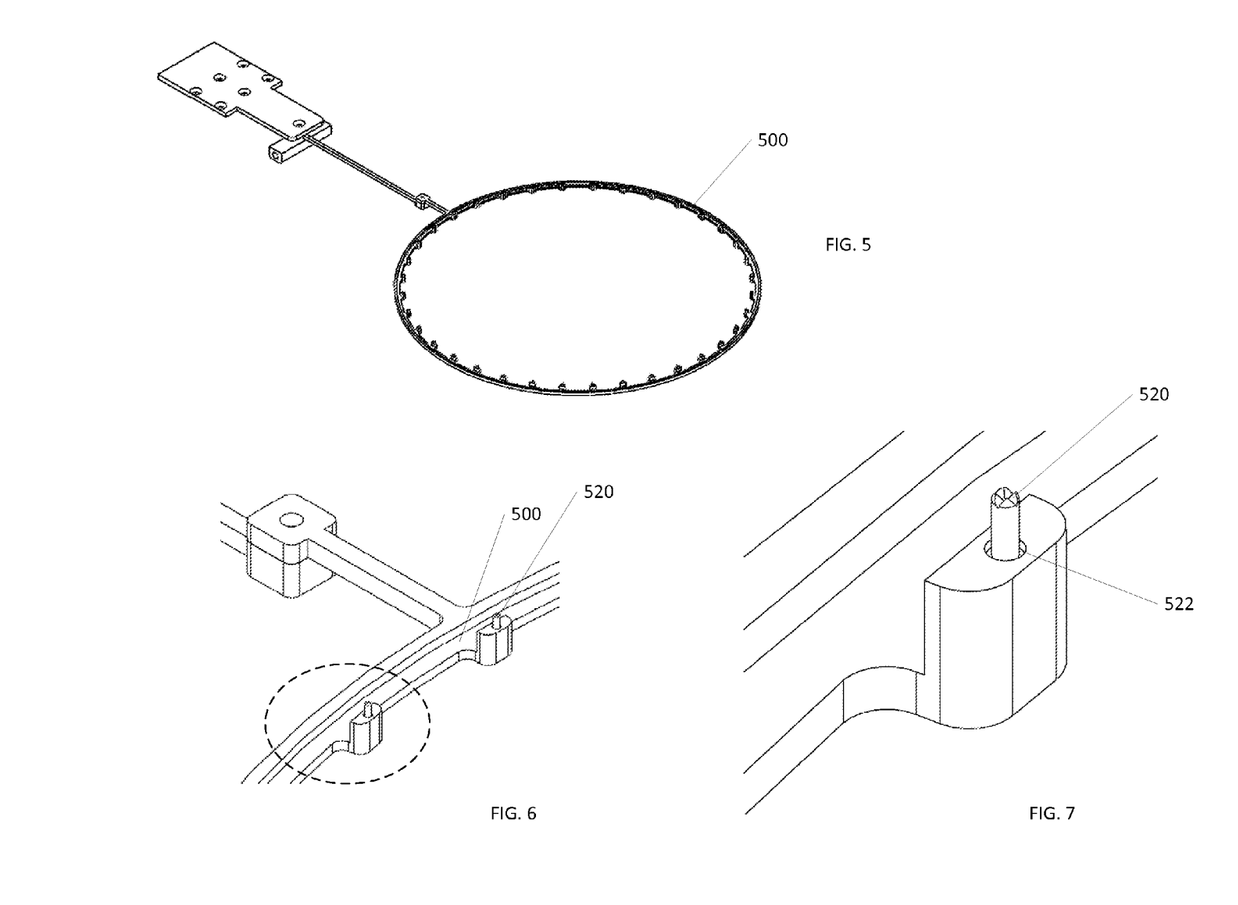
FIGS. 5-7 depicts an embodiment of a wafer plating jig cover having a bus ring.

FIGS. 5-7 illustrate an embodiment of the wafer plating jig system having a conductive bus ring 500 extending around the opening of the cover plate 130. In practice, the conductive bus ring 500 is electrically charged with a negative charge during the plating process and an electrically conductive contact pin 520 is included to transfer that charge to the conductive dielectric surface of the semiconductor wafer. In some particular embodiments, the contact pin 520 is coupled into a socket 522 that allows the contact pin 520 to be removed and replaced when needed. This design offers the advantage of allowing the conductive contact pin 520 to remain sealed off and not in direct contact with the plating solution. One of ordinary skill in the art would recognize that while any suitable mechanism or methodology may be used to secure the replaceable contact pin 520, the contact pin 520 may be spring loaded to provide spring-pressure mating between the respective surfaces that it is connecting. Additional alignment pins 342 (FIG. 4B) may be used to align the cover plate 130, 230 with the base 110, 210 by fitting into alignment pin voids 340 (FIGS. 3B and 4B) on the base 110, 210.

As shown in FIG. 1, some embodiments further comprise a radio frequency identification ("RFID") tag 420 embedded within or mounted to the cover plate 130, 230. This allows for identification of the semiconductor wafer ID number or other identifying information which may be used to obtain information as to the size or other characteristics of the wafer. For example, if a customer for whom the wafer is being manufactured has specific requirements that affect how the plating process must be set up or conducted, the RFID tag 420 embedded in the cover plate 130, 230 allows these requirements to be identified automatically for adjustment of the plating or other processing equipment for the semiconductor wafer.

FIGS. 4B and 5-7 provide a cross-sectional view of an assembled wafer plating jig 700 comprising a dual sided electrically insulating base 210, a plurality of concentric, overlapping cavities 120, 122 each in tiered relation to the others forming a step pattern from a smallest cavity 122 at a lowest, innermost position, graduating to the largest cavity 122 is at the highest, outermost position. When looking face-on to the plurality of cavities 120, 122 in this particular embodiment, they are concentric along a common axis and have overlapping footprints, although being concentric along a common axis is not required in all embodiments. One or more magnetic attractors 140 is positioned at each of the plurality of cavities 120, 122 for this embodiment to attract and magnetically couple to a cover plate 130, 230 used to capture the semiconductor wafer 700 between the cover plate 130, 230 and the base 210 through magnetic attraction between the cover plate 130, 230 and a magnetic attractor 140 of the base 210. One or more ferrous metal rings, magnets or other magnetically attractive components 150 responsive to magnetic attraction by the magnetic attractors 140 of the base 210 are located on each cover plate 130, 230.

Each cover plate 130, 230 further comprises at least one of a replaceable inner compression fit seal 400 and replaceable outer compression fit seal 410 positioned in relation to the semiconductor wafer 700 to create a liquid-tight seal between the base 210, the semiconductor wafer 700 and the cover plates 130, 230 during the wafer plating process while the semiconductor wafer 700 is immersed in a chemical plating bath. An electrically conductive conductor, such as a bus ring 500 extends around the opening of the cover plates 130, 230 and may also function as the magnetically attractive material 150 in particular embodiments where such material is used to form the conductive bus ring 500.

Figure 8:
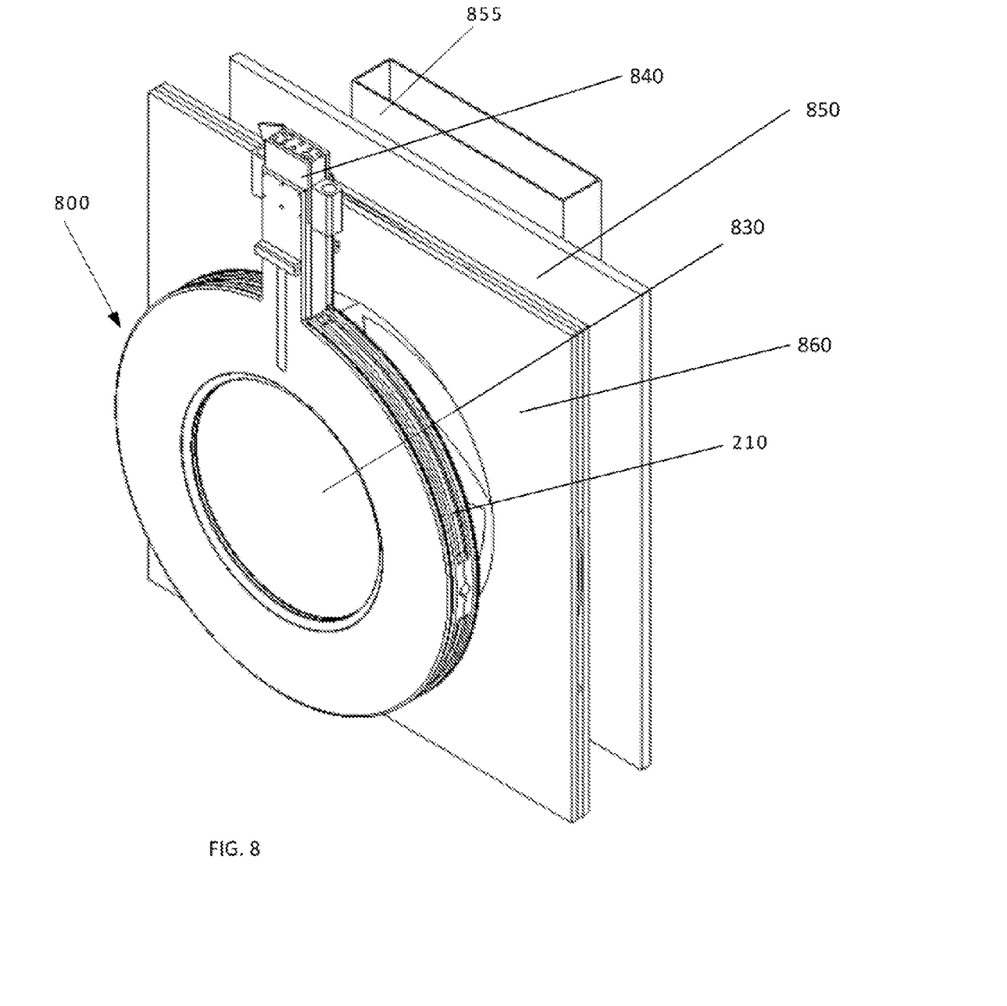
FIG. 8 is a perspective view of an embodiment of a wafer plating jig having a wafer housed within the assembly.

FIG. 8 provides an illustration of an embodiment of a wafer plating jig system in use for plating a wafer. In this embodiment, a dual-sided wafer plating jig system 800 is used, but the anode and shields are not duplicated on the second side of the wafer plating jig system 800 for ease in viewing the wafer plating jig system 800. In practice, however, a second set of shields 850, 860, and a second anode 855 would be included adjacent the other side of the wafer plating jig system 800 shown in the illustration. A semiconductor wafer 830 (one is included on each side of the dual-sided wafer plating jig system 800, and in this particular example both are similarly configured) is held in the wafer plating jig system 800 and placed in a plating bath for wafer plating. The wafer plating jig system 800 is held in position in front of an appropriate plating anode 855 with one or more plating shields 850, 860 between the anode and the semiconductor wafer 830. The wafer plating jig system 800 is coupled electrically to a control system (not shown) providing appropriate negative charge to the wafer plating jig system 800 for the plating process through connector 840. For this embodiment, the semiconductor wafer 830 is exposed to an electric current through the bath from the anode 855 through both a shield 850 having a fixed opening size and a shield 860 having an adjustable opening size. The plating process is known to those of ordinary skill in the art.

Figure 9:
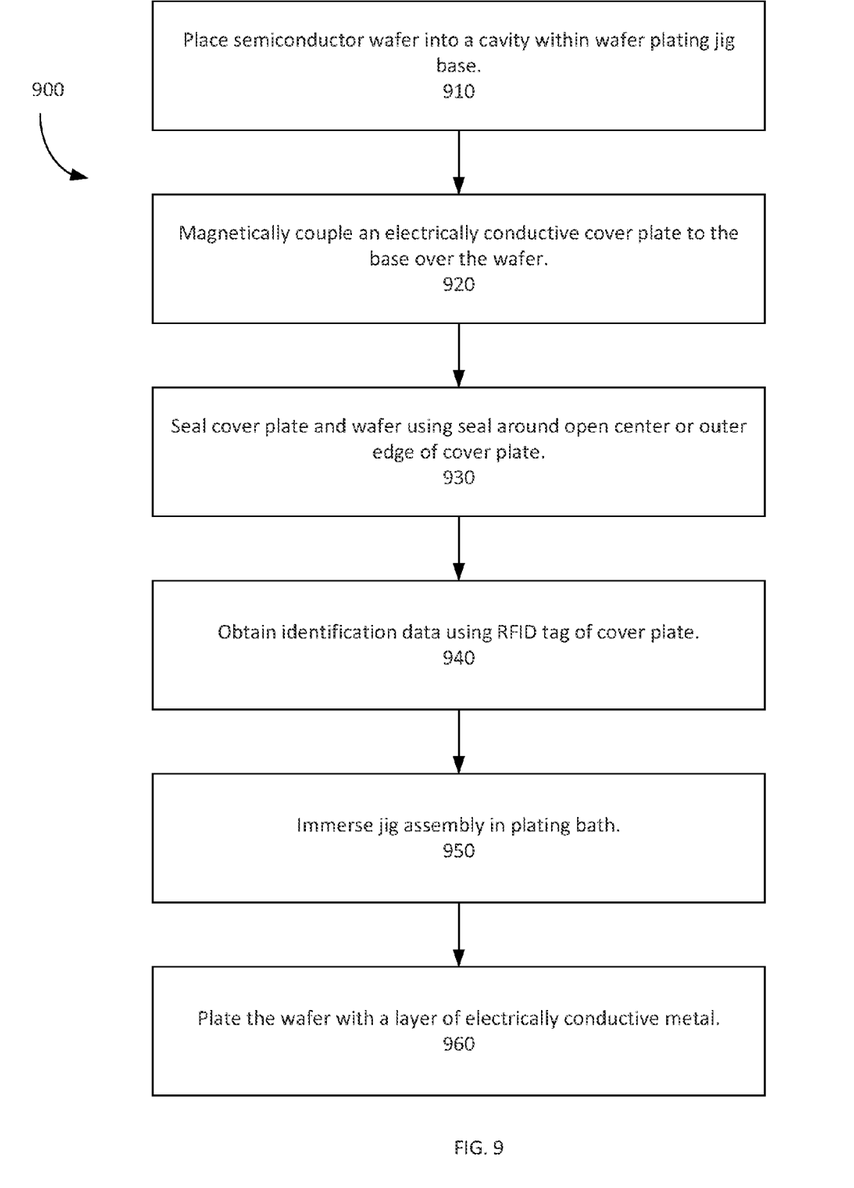
FIG. 9 is a block diagram of an embodiment of a method of producing a semiconductor wafer.

FIG. 9 is a block diagram of a non-limiting example of a method 900 of plating a semiconductor wafer. A wafer is placed into a first cavity among a plurality of overlapping cavities within an electrically insulating base of a wafer plating jig (step 910). The plurality of cavities may further comprise one or more magnetic attractors in accordance with any of the embodiments of the wafer plating jig system described above. An electrically conductive cover plate is then magnetically coupled to the base over the semiconductor wafer (step 920). In some embodiments, an edge of the semiconductor wafer is covered by and electrically connected to the cover plate and a center of the semiconductor wafer is exposed through the open center of the cover plate. A junction between the semiconductor wafer and the cover plate may be sealed using a seal positioned around the open center of the cover plate the outer edge of the cover plate that is in contact with the wafer during the plating process (step 930). Identification data relating to the semiconductor wafer may be obtained using an RFID tag located on or embedded in the cover plate (step 940), which may be used to provide specific configuration requirements or other customer data that is necessary to properly plate the wafer and even to adjust the adjustable opening size for the wafer plating jig system. The wafer plating jig system is then immersed in a plating bath having an anode within the bath and an electric potential is applied across the anode and the cover plate using at least one removable contact pin that is engaged with the semiconductor wafer (step 950). At least a portion of the exposed center of the semiconductor wafer is then plated with a layer of electrically conductive conductor (step 960).

While copper is commonly used as the electrically conductive metal with which the semiconductor wafer is coated, one of ordinary skill in the art would recognize that any other electrically conductive metal or alloy such as, for example, nickel, tin, tin-alloys, and other metals and metal alloys may also be used. Similarly, while it may be preferable to plate round semiconductor wafers having a diameter of 200, 300, or 450 millimeters, one of ordinary skill in the art would also recognize that any other shape or diameter wafer may also be plated using embodiments of the present disclosure.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

The particular features, structures or characteristics described herein may be combined as suitable in one or more embodiments of the disclosure. In addition, while the inventions have been described in terms of several embodiments, those skilled in the art will recognize that the disclosure is not limited to the embodiments described. The embodiments of the disclosure can be practiced with modification and alteration within the scope of the appended claims. The specification and the drawings are thus to be regarded as illustrative instead of limiting on the disclosure.

What is claimed is:

1. A wafer plating jig system comprising:
    an electrically insulating wafer plating jig base having a plurality of at least partially overlapping cavities of different depths, each cavity configured to receive a semiconductor wafer of a different size;
    a plurality of magnetic attractors, at least one positioned within a footprint of each of the plurality of overlapping cavities; and
    an electrically conductive cover plate comprising an open center surrounded by a support, the cover plate comprising a magnetically attractive material positioned within the support adjacent to the open center and aligned with at least one of the magnetic attractors when the cover plate is positioned over the wafer plating jig base.

2. The wafer plating jig system of claim 1, wherein the magnetically attractive material comprises a ferro-magnetic material.

3. The wafer plating jig system of claim 1, wherein the magnetically attractive material comprises iron.

4. The wafer plating jig system of claim 1, wherein the cover plate further comprises an RFID tag.

5. The wafer plating jig system of claim 1, wherein the cover plate further comprises an inner compression fit seal adjacent to the open center and on a surface facing the wafer plating jig base when the cover plate is positioned over the wafer plating jig base concentric with at least one of the plurality of overlapping cavities.

6. The wafer plating jig system of claim 1, wherein the cover plate further comprises an outer compression fit seal distal to the open center and on a surface of the cover plate facing the wafer plating jig base when the cover plate is positioned over the wafer plating jig base concentric with at least one of the plurality of overlapping cavities.

7. The wafer plating jig system of claim 6, wherein at least one of the plurality of magnetic attractors is positioned between the outer compression fit seal and an outer edge of one of the overlapping cavities when the cover plate is positioned over the wafer plating jig base with the open center with the plurality of overlapping cavities.

8. The wafer plating jig system of claim 1, wherein a first of the plurality of overlapping cavities is configured to receive a round wafer having a diameter of 300 millimeters.

9. The wafer plating jig system of claim 8, wherein a second of the plurality of overlapping cavities is configured to receive a round wafer having a diameter of 200 millimeters or 450 millimeters.

10. The wafer plating jig system of claim 1, the cover plate further comprising an electrically conductive conductor on the support surrounding the open center, wherein the cover plate further comprises at least one electrically conductive contact pin removably coupled with the electrically conductive conductor.

11. The wafer plating jig system of claim 1, wherein the cover plate is a first cover plate, the system further comprising a second cover plate comprising an open center larger than the open center of the first cover plate and surrounded by a support, the second cover plate comprising a magnetically attractive material positioned within the support adjacent to the open center and aligned with a different one of the magnetic attractors of the base than the magnetically attractive material of the first cover plate is aligned with when the cover plate is positioned over the wafer plating jig base.

12. The wafer plating jig system of claim 1, the plurality of overlapping cavities being a first plurality of overlapping cavities and being positioned on a first side of the wafer plating jig base, the wafer plating jig base further comprising a second plurality of overlapping cavities positioned on a second side of the wafer plating jig base opposite the first side.

13. The wafer plating jig system of claim 12, wherein the cover plate is a first cover plate, the system further comprising a second cover plate comprising an open center surrounded by a support, the second cover plate comprising a magnetically attractive material positioned within the support adjacent to the open center and aligned with at least one of the magnetic attractors of the magnetically attractive material of the second cover plate when the second cover plate is positioned over the second side of the wafer plating jig base.

14. A wafer plating jig system comprising:
an electrically insulating wafer plating jig base having at least one cavity configured to receive a semiconductor wafer;
at least one magnetic attractor positioned at the at least one cavity adjacent to an edge of the at least one cavity; and
an electrically conductive cover plate comprising an open center surrounded by a support, the cover plate comprising a magnetically attractive material positioned within the support adjacent to the open center and aligned with the at least one magnetic attractor when the cover plate is positioned over the wafer plating jig base.

15. The wafer plating jig system of claim 14, wherein the magnetically attractive material comprises a ferro-magnetic material.

16. The wafer plating jig system of claim 14, wherein the magnetically attractive material comprises iron.

17. The wafer plating jig system of claim 14, wherein the cover plate further comprises an embedded RFID tag.

18. The wafer plating jig system of claim 14, wherein the cover plate further comprises an inner compression fit seal adjacent to the open center and on a surface facing the wafer plating jig base when the cover plate is positioned over the wafer plating jig base concentric with the at least one cavity.

19. The wafer plating jig system of claim 14, wherein the cover plate further comprises an outer compression fit seal distal to the open center and on a surface facing the wafer plating jig base when the cover plate is positioned over the wafer plating jig base concentric with the at least one cavity.

20. The wafer plating jig system of claim 19, wherein the at least one magnetic attractor is positioned between the outer compression fit seal and an outer edge of the at least one cavity when the cover plate is positioned over the wafer plating jig base with the open center concentric with the at least one cavity.

21. The wafer plating jig system of claim 14, wherein the at least one cavity is configured to receive a round wafer having a diameter of 300 millimeters.

22. The wafer plating jig system of claim 14, wherein the at least one cavity is configured to receive a round wafer having a diameter of 200 millimeters or 450 millimeters.

23. The wafer plating jig system of claim 14, the cover plate further comprising an electrically conductive conductor on the support surrounding the open center, wherein the cover plate further comprises at least one electrically conductive contact pin removably coupled with the electrically conductive conductor.

24. The wafer plating jig system of claim 14, further comprising a second electrically conductive cover plate comprising a magnetically attractive material positioned within a support adjacent to an open center of the second cover plate and aligned with the at least one magnetic attractor when the cover plate is positioned over the wafer plating jig base.

25. The wafer plating jig system of claim 14, further comprising at least a second cavity located on a side of the wafer plating jig base that is opposite a side of the wafer plating jig base on which the at least one cavity is located.

26. A wafer plating jig system comprising:
an electrically insulating wafer plating jig base having a plurality of concentric overlapping cavities of different depths, each cavity configured to receive a semiconductor wafer of a different size;
at least one magnetic attractor positioned at the plurality of concentric overlapping cavities adjacent to an edge of the plurality of concentric overlapping cavities; and
an electrically conductive cover plate comprising an open center surrounded by a support, the cover plate comprising a magnetically attractive material positioned within the support, and an electrical conductor surrounding the open center and concentric with at least one of the concentric overlapping cavities of the wafer plating jig base, wherein the at least one magnetic attractor is positioned within a footprint of the electrically conductive cover plate between an outer compression fit seal and an outer edge of the plurality of concentric overlapping cavities when the cover plate is positioned over the wafer plating jig base with the open center concentric with the a plurality of concentric overlapping cavities.

27. The wafer plating jig system of claim 26, wherein the cover plate further comprises an embedded RFID tag.

28. The wafer plating jig system of claim 26, wherein the cover plate further comprises an inner compression fit seal adjacent to the open center and on a surface facing the wafer plating jig base when the cover plate is positioned over the wafer plating jig base concentric with the plurality of concentric overlapping cavities.

29. The wafer plating jig system of claim 26, wherein the cover plate further comprises the outer compression fit seal distal to the open center and on a surface facing the wafer plating jig base when the cover plate is positioned over the wafer plating jig base concentric with the a plurality of concentric overlapping cavities.

30. The wafer plating jig system of claim 26, wherein the plurality of concentric overlapping cavities is configured to receive a round wafer having a diameter of 200 millimeters.

31. The wafer plating jig system of claim 26, wherein the plurality of concentric overlapping cavities is configured to receive a round wafer having a diameter of 300 millimeters or 450 millimeters.

32. The wafer plating jig system of claim 26, the cover plate further comprising an electrically conductive conductor on the support surrounding the open center, wherein the cover plate further comprises at least one electrically conductive contact pin removably coupled with the electrically conductive conductor.

33. The wafer plating jig system of claim 26, further comprising a second electrically conductive cover plate comprising a magnetically attractive material positioned within a support adjacent to an open center of the second cover plate and aligned with the at least one magnetic attractor when the cover plate is positioned over the wafer plating jig base.

* * * * *